United States Patent
Ferrieux et al.

(10) Patent No.: US 12,432,010 B2
(45) Date of Patent: Sep. 30, 2025

(54) METHOD AND DEVICE FOR QUANTIZING DATA REPRESENTATIVE OF A RADIO SIGNAL RECEIVED BY A RADIO ANTENNA OF A MOBILE NETWORK

(71) Applicant: ORANGE, Issy-les-Moulineaux (FR)

(72) Inventors: Alexandre Ferrieux, Chatillon (FR); Fabrice Guillemin, Chatillon (FR); Veronica Karina Quintuna Rodriguez, Chatillon (FR)

(73) Assignee: ORANGE, Issy-les-Moulineaux (FR)

( * ) Notice: Subject to any disclaimer, the term of this patent is extended or adjusted under 35 U.S.C. 154(b) by 423 days.

(21) Appl. No.: 17/928,089

(22) PCT Filed: May 20, 2021

(86) PCT No.: PCT/FR2021/050901
§ 371 (c)(1),
(2) Date: Nov. 28, 2022

(87) PCT Pub. No.: WO2021/240096
PCT Pub. Date: Dec. 2, 2021

(65) Prior Publication Data
US 2023/0208553 A1    Jun. 29, 2023

(30) Foreign Application Priority Data
May 26, 2020   (FR) ...................... 2005539

(51) Int. Cl.
*H04L 1/06*    (2006.01)
*H04L 1/00*    (2006.01)
*H04L 1/20*    (2006.01)

(52) U.S. Cl.
CPC .......... *H04L 1/0045* (2013.01); *H04L 1/0006* (2013.01); *H04L 1/203* (2013.01)

(58) Field of Classification Search
CPC ...... H03M 1/007; H03M 7/3059; H03M 7/50; H04L 1/0002; H04L 1/0006; H04L 1/0045; H04L 1/203; H04W 88/085
See application file for complete search history.

(56) References Cited

U.S. PATENT DOCUMENTS

| | | | | |
|---|---|---|---|---|
| 2001/0020285 | A1* | 9/2001 | Fujiwara | ............... H04L 1/0066 714/758 |
| 2009/0238287 | A1* | 9/2009 | Lee | ........................ H04L 25/067 375/243 |
| 2023/0261914 | A1* | 8/2023 | Ferrieux | ............... H04L 1/0002 375/262 |

FOREIGN PATENT DOCUMENTS

EP    1128587 A2 *    8/2001    ............. H04B 7/022

OTHER PUBLICATIONS

French Written Opinion dated Dec. 3, 2021 for corresponding French Application No. 2005539, filed May 26, 2020.

(Continued)

*Primary Examiner* — Phuc H Tran
(74) *Attorney, Agent, or Firm* — David D. Brush; Westman, Champlin & Koehler, P.A.

(57) ABSTRACT

A method and a device for matching a quantization table of data representative of a radio signal received by a radio antenna of a mobile network. The method includes: obtaining an item of information representative of a channel decoding error rate of a decoded quantized demodulated signal from a demodulation of the radio signal received by the antenna, the demodulated radio signal having been quantized by the quantization table, and the quantized demodulated radio signal having undergone a channel decoding; matching the quantization table when the channel decoding error rate is higher than a determined threshold; and transmitting an item of information representative of the (Continued)

matching of the quantization table to a channel decoding device or to a demodulation device.

10 Claims, 8 Drawing Sheets

(56) References Cited

OTHER PUBLICATIONS

International Search Report dated Sep. 21, 2021 for corresponding International Application No. PCT/FR2021/050901, filed May 20, 2021.
Written Opinion of the International Searching Authority dated Sep. 21, 2021 for corresponding International Application No. PCT/FR2021/050901, filed May 20, 2021.
Ling Xinyue et al., "Optimization of Quantization Levels for Quantize-and-Forward Relaying with QAM Signaling", 2018 Asia-Pacific Signal and Information Processing Association Annual Summit and Conference (APSIPA ASC), APSIPA Organization, Nov. 12, 2018 (Nov. 12, 2018), p. 159-164, XP033525891.
Miyamoto Kenji et al., "Wireless performance and mobile fronthaul bandwidth of uplink joint reception with LLR combining in split-PHY processing", Dec. 1, 2018 (Dec. 1, 2018), vol. 20, No. 6, p. 536-545, XP011706851.
Miyamoto Kenji et al., "Unified Design of LLR Quantization and Joint Reception for Mobile Fronthaul Bandwidth Reduction", 2017 IEEE 85th Vehicular Technology Conference (VTC Spring), IEEE, Jun. 4, 2017 (Jun. 4, 2017), p. 1-5, XP033254417.
"3rd Generation Partnership Project; Technical Specification Group Radio Access Network; Study on new radio access technology: Radio access architecture and interfaces (Release 14)", 3GPP TR 38.801 V14.0.0 (Mar. 2017).
"O-RAN Fronthaul Working Group—Control, User and Synchronization Plane Specification", ORAN-WG4.CUS.0-v01.00 specification of ORAN, O-RAN, 2019.
Rodriguez, V. Q. et al., "Cloud-RAN functional split for an efficient fronthaul network", paper presented at the IEEE conference, IWCMC 2020.

* cited by examiner

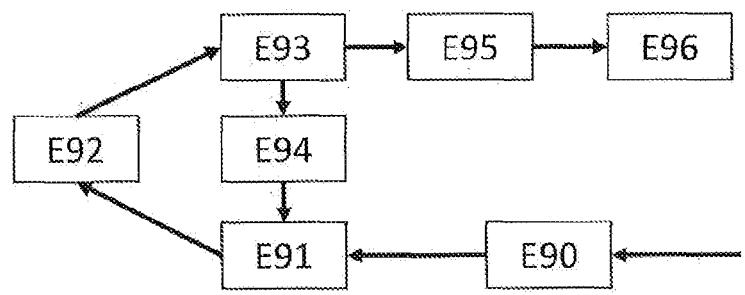
FIG. 9
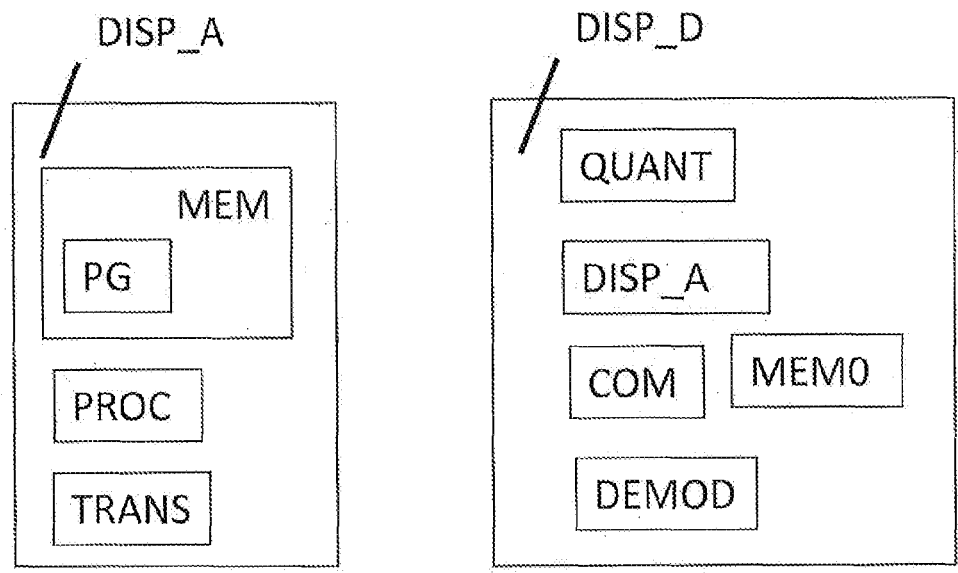
FIG. 10
FIG 11

METHOD AND DEVICE FOR QUANTIZING DATA REPRESENTATIVE OF A RADIO SIGNAL RECEIVED BY A RADIO ANTENNA OF A MOBILE NETWORK

CROSS-REFERENCE TO RELATED APPLICATIONS

This Application is a Section 371 National Stage Application of International Application No. PCT/FR2021/050901, filed May 20, 2021, which is incorporated by reference in its entirety and published as WO 2021/240096 A1 on Dec. 2, 2021, not in English.

FIELD OF THE INVENTION

The invention relates to the field of cellular networks and more specifically to the exchange of information between different functions of the Radio Access Network (RAN).

PRIOR ART

Figure 1:
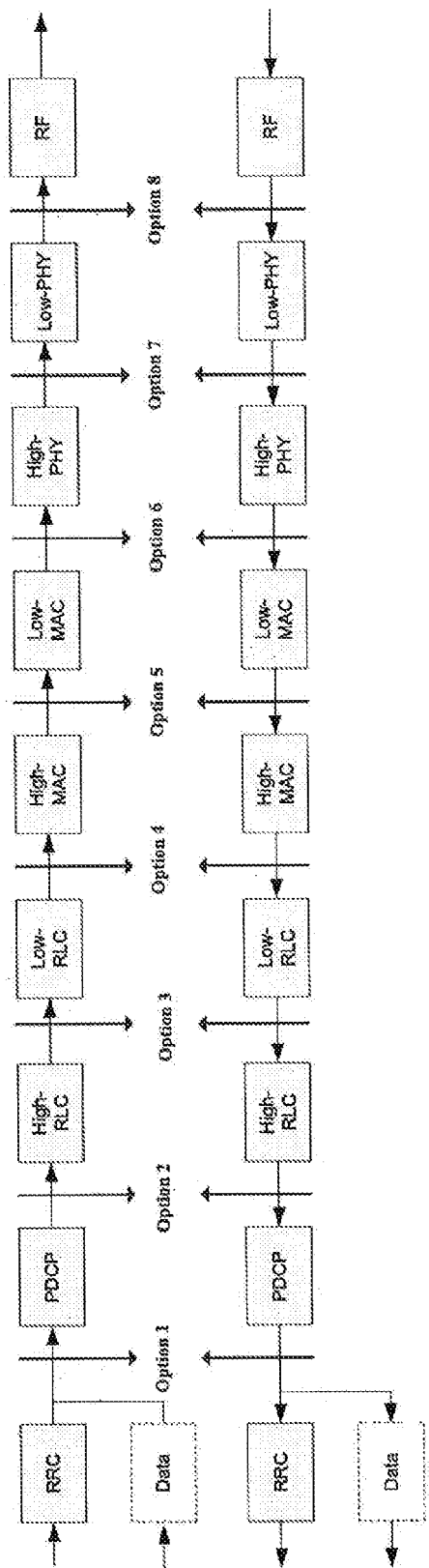

The functions of the radio access network can be broken down into several functional blocks: PDCP, RLC, MAC, (de) coding, Rate Matching, Modulation, etc. Such functional decomposition possibilities are illustrated in FIG. 1 showing the possible decomposition options described in the 3*GPP* (3*rd Generation Partnership Project*) *Study on new radio access technology: Radio access architecture and interfaces*, March 2017, TR38.801 V14.0.7.

In actual embodiments, these different functions are performed by a single computing platform that is part of a Base Band Unit (BBU). For example, such a platform could be a dedicated server at the foot of an antenna.

However, with the evolution of radio functions and the grouping of some of these functions within centralised computing platforms (also known as Cloud-RAN) notably to achieve economies of scale and better management of radio resources, the RAN functions can be split according to several options (see 3GPP TR 38.801 specification as shown in FIG. 1). Among these options, a split or option 7.3 consists of separating the RAN functions into at least two blocks: the low functions ((de) modulation, analogue/digital conversion, FFT, etc.) on the one hand and the high functions on the other ((de) coding, MAC—Media Access Control, etc.) in the uplink and downlink directions. The RLC (Radio Link Control) and PDCP (Packet Data Convergence Protocol) functions can themselves be implemented even further up the network (e.g. by means of a split called option 2).

Figure 2A:
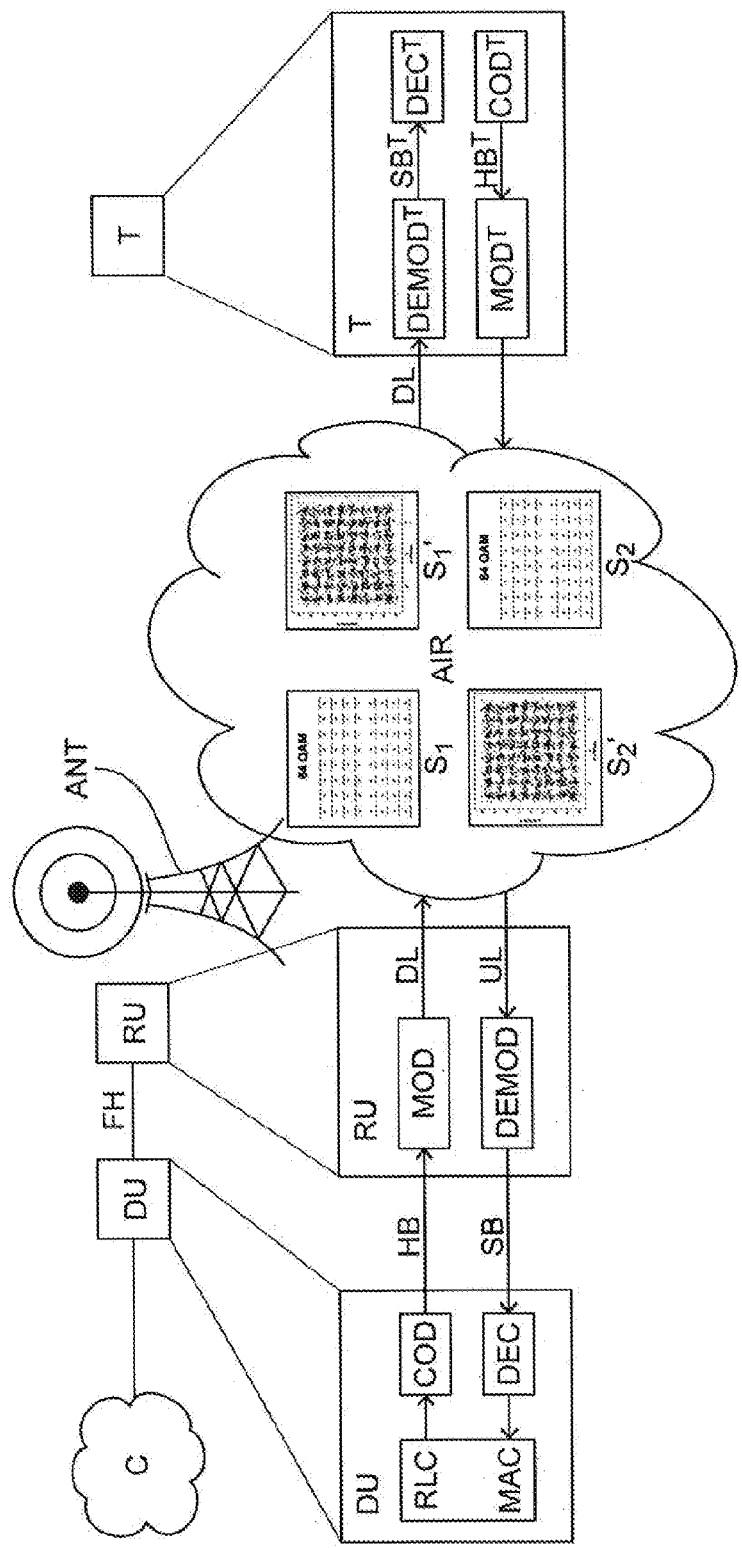

Option 7.3 is detailed in a simplified manner in FIG. 2A. It should be noted that this option 7.3 is only considered by 3GPP in the downlink direction. FIG. 2A schematically illustrates the exchange of data between a network core C and an antenna ANT via which a terminal T transmits and receives data. As shown in FIG. 2A, the modulation/demodulation and coding/decoding functions are implemented in separate units. For example, the functions of modulation (MOD) in the downlink direction (DL) and demodulation (DEMOD) in the uplink direction (UL) are implemented by a first unit (RU) and the functions of coding (COD), decoding (DEC), RLC and MAC are implemented by a second unit (DU), the high functions PDCP, RRC can be implemented by a third unit (CU, not shown). In the DL downlink direction, the encoding module (COD) transmits HB data in the form of "hard bits" to the modulation module (MOD). This hard bit HB data is a bit sequence from the channel coding implemented for the transmission of source data received from the core network over the mobile network. The modulation module (MOD) then transmits I/Q modulated symbols.

In the uplink direction UL, the demodulation module (DEMOD) receives I/Q symbols which it demodulates into "soft bit" data SB. The demodulation module (DEMOD) transmits these soft bits SB to the decoding module (DEC). This soft bit data SB is real data, and non-binary.

In general, the inverse operations take place in the terminal T. It should be noted that the implementation in the terminal is dependent on the terminal manufacturer. However, the general operation described by the standard is as follows.

The terminal T receives modulated I/Q symbols from the base station, i.e. in the downlink direction DL. These I/Q symbols have been transformed into a radio signal when transmitted through the air by the base station. On reception by the terminal T, these I/Q symbols are demodulated by the terminal's demodulation module ($DEMOD^T$) in the form of soft bits ($SB^T$). The demodulation module ($DEMOD^T$) transmits these "soft bits" ($SB^T$ to the decoding module of the terminal ($DEC^T$).

When data is transmitted by the terminal to the base station, i.e. in the uplink direction UL, the terminal's encoding module ($COD^T$) transmits hard bits ($HB^T$) to the terminal's modulation module ($MOD^T$), which modulates them into I/Q modulated symbols which are then transmitted on the radio channel.

Examples of I/Q signals are illustrated diagrammatically in FIG. 2A. For example, FIG. 2A shows:
an I/Q radio signal $S_1$ transmitted by the base station ANT and the corresponding I/Q radio signal $S_1'$ received by the terminal T, and
an I/Q radio signal $S_2$ transmitted by the terminal T and the corresponding I/Q radio signal $S_2'$ received by the base station ANT.

It appears that the received signals $S_1'$ and $S_2'$ are noisy compared to the corresponding transmitted signals $S_1$ and $S_2$.

For reasons of channel decoding efficiency, the demodulation modules of the antenna and the terminal respectively transmit demodulated data, commonly known as soft bits, to the channel decoding module. The soft bits represent the Log-Likelihood Ratio (LLR) of the IQ symbols received by the antenna of the base station or terminal after demodulation of the received signal. In other words, the LLR signal represents the ratio between the probability that a particular bit in the received signal is a 1 and the probability that this bit is a 0. The use of LLR data by the decoding module can obtain good performance for the channel decoding methods.

In most embodiments, this LLR data is encoded on 16 or 12 bits. When LLRs are processed locally, i.e. the demodulation and decoding functions are implemented by the same unit, this representation does not pose a problem.

However, some network function splits, as illustrated in FIG. 2A, propose to separate the demodulation function from the decoding function. The LLR data must then be transported between the high and low functions of the RAN.

Examples of the rates required to transmit LLR data are illustrated in table 1 below for a 64 QAM modulation. This rate varies according to the level of coding or Modulation and Coding Scheme (MCS).

It is clear that the rates can reach very high values, which can cause sizing problems for the fronthaul network (first part of the access network), which connects the high functions to the low functions.

TABLE 1

Required rate on the fronthaul according to the
LLR coding level for 64QAM modulation.

| LLR coding level | Rate [Gbps] |
| --- | --- |
| 1 | 4.05 |
| 2 | 8.10 |
| 3 | 12.15 |
| 4 | 16.20 |
| 5 | 20.25 |
| 6 | 24.30 |
| 7 | 28.35 |
| 8 | 32.40 |
| 9 | 36.45 |
| 10 | 40.50 |
| 11 | 44.55 |
| 12 | 48.60 |
| 13 | 52.65 |
| 14 | 56.70 |
| 15 | 60.75 |

Table 1. Required rate on the fronthaul according to the LLR coding level for 64QAM modulation.

Figure 3:
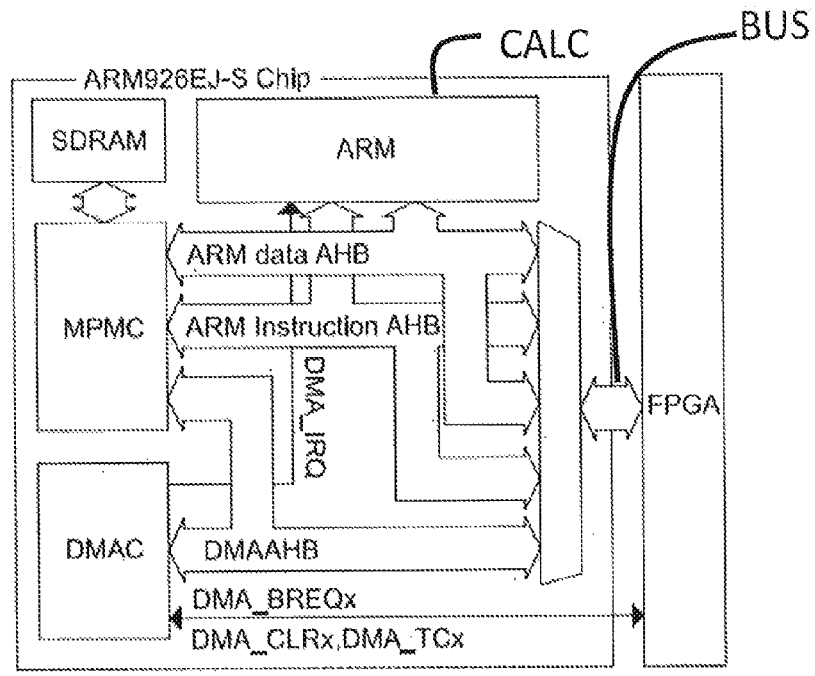

Such a problem also appears when the encoding/decoding functions are moved to an FPGA (Field Programmable Gate Array) component to save computing time, as shown in FIG. 3. FIG. 3 shows an FPGA component for encoding/decoding and a CALC computing platform performing the other RAN functions. According to such an implementation, the soft bits are transferred to the FPGA component via a communication bus (BUS). The rate required to transmit the soft bits is a brake to such implementations, as communication buses are not suitable for transmitting such large amounts of data with a reasonable latency with respect to service constraints.

Earlier techniques consisted in transferring I/Q symbols, i.e. before demodulation, between the high and low functions of the RAN, notably in the 7.2 option retained by ORAN. To reduce the bandwidth between the two groups of functions of the RAN, the ORAN method proposes to compress the I/Q symbols carried between the high and low functions of the RAN. Several compression methods are identified in the ORAN-WG4.CUS.0-v01.00 specification of ORAN (*O-RAN Fronthaul Working Group, "Control, User and Synchronization Plane Specification," O-RAN, Specification*, 2019). However, these methods can lead to a significant degradation of the radio signal, which seems totally unrealistic in an operational context.

There is therefore a need to improve the prior art.

SUMMARY OF THE INVENTION

The invention improves the prior art. To this end, it relates to a method for matching a quantization table of data representative of a radio signal received by a radio antenna of a mobile network. Such a method comprises:
  obtaining an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding,
  matching the quantization table when the channel decoding error rate is higher than a determined threshold,
  transmitting an item of information representative of the matching of the quantization table to a channel decoding device or to a demodulation device.

The invention can thus reduce the rate required for the transmission of soft bits between the demodulation device and the channel decoding device, notably when these devices are implemented on two separate units.

In the case where the decoding process is implemented by a specific circuit, such as an FPGA, the reduction of the coding size of the soft bits or LLRs can reduce the bandwidth on the communication bus between the FPGA component and the rest of the RAN functions and thus gain a possible multiplexing factor if several FPGA components are connected to the communication bus.

Advantageously, the matching method according to the invention takes into account the performance of the channel decoding and matches the quantization table in real time according to the BLER of the signal. The quantization table used for quantization is thus optimised according to the BLER observed on the received radio signal. In other words, the quantization of the signal is optimised from end to end according to the quality criterion of the soft bit decoding, which also optimises the rate required for transmitting soft bits.

Thus, when the quantization impacts too strongly on channel decoding, or when the environmental conditions of the radio signal transmission produce a signal that is too noisy, it is possible to match the quantization table to reduce the impact of quantization and limit decoding errors.

The matching method can be implemented by the demodulation device of the received radio signal, which in this case receives the BLER item of information from the channel decoding device of the demodulated signal and then transmits to the channel decoding device an item of information indicating the use of a new quantization table.

According to another variant, the matching method can be implemented by the channel decoding device which then determines the new quantization table and then transmits information to the demodulation device indicating a new quantization table to use.

According to a particular embodiment of the invention, the matching method further comprises the matching of the quantization table when the channel decoding error rate is below another determined threshold. According to this particular embodiment of the invention, the quantization table is also matched when the BLER observed is below a determined threshold. This can increase the data compression when the radio signal transmission environment is good and the quantization of the demodulated signal has little or no impact on the channel decoding performances.

According to another particular embodiment of the invention, the matching of the quantization table comprises the selection of a new pre-calculated quantization table. According to this particular embodiment of the invention, a set of quantization tables has been pre-calculated. Thus, the matching of the quantization table according to the observed BLER is simple to implement.

According to another particular embodiment of the invention, the new pre-calculated quantization table belongs to a group of pre-calculated quantization tables in which each quantization table is associated with a maximum channel decoding error rate threshold and a minimum channel decoding error rate threshold, the new quantization table being selected according to the value of the channel decoding error rate of the received radio signal in relation to the minimum and maximum channel decoding error rate thresholds associated with the quantization tables of the group.

According to another particular embodiment of the invention, the matching of the quantization table comprises the calculation of a new quantization table from the demodulated received radio signal. According to this particular embodiment of the invention, a real-time learning of the quantization table is performed from the received signal values. Hence, the quantization table is determined from real transmission conditions.

According to another particular embodiment of the invention, each value of the demodulated signal is representative of a log-likelihood ratio of a symbol of said radio signal received by said antenna.

Correspondingly, the invention also relates to a device for matching a quantization table of data representative of a radio signal received by a radio antenna of a mobile network, comprising a processor and a memory configured for:
- obtaining an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding, and
- matching the quantization table when the channel decoding error rate is higher than a determined threshold,
- transmitting an item of information representative of the matching of the quantization table to a channel decoding device or to a demodulation device.

The invention also relates to a device for demodulating a radio signal received by a radio antenna of a mobile network, comprising:
- a demodulation module configured to demodulate said radio signal received by said antenna, providing a demodulated signal,
- a quantization module configured to quantize each value of said demodulated signal using a quantization table, providing a quantized demodulated signal,
- a transmission module configured to transmit said quantized demodulated signal to a channel decoding module, and
- a matching device as cited above.

The invention also relates to a channel decoding device of a quantized demodulated signal, comprising:
- a reception module configured to receive said quantized demodulated signal from a demodulation device configured to demodulate a radio signal received by a radio antenna of a mobile network,
- an inverse quantization module configured to quantize each value of said quantized demodulated signal inversely using a de-quantization table, providing a de-quantized demodulated signal,
- a channel decoding module configured to decode said de-quantized demodulated signal.
- a calculation module configured to calculate a channel decoding error rate of the decoded de-quantized demodulated signal, and
- a matching device as cited above.

The invention also relates to a device of a mobile network comprising:
- a demodulation device configured to demodulate said radio signal received by said antenna, providing a demodulated signal, and to quantize each value of said demodulated signal using a quantization table, providing a quantized demodulated signal,
- a channel decoding device in the form of a programmable circuit configured to implement a channel decoding scheme for the de-quantized demodulated signal,
- at least one communication bus able to transmit the quantized demodulated signal from the demodulation device to the channel decoding device, and
- a matching device as cited above comprised in the demodulation device or in the channel decoding device.

The invention also relates to a server comprising at least one matching device or demodulation device or channel decoding device or mobile network device, as described above.

The invention also relates to a mobile network system comprising:
- at least one radio antenna, configured for receiving a radio signal,
- at least one unit for implementing low functions of the mobile network, comprising at least one demodulation device configured to demodulate said radio signal received by said antenna, providing a demodulated signal, to quantize each value of said demodulated signal using a quantization table, providing a quantized demodulated signal, and to transmit said quantized demodulated signal to a channel decoder module,
- at least one unit for implementing high functions of the mobile network, comprising at least one channel decoding device configured to receive said quantized demodulated signal from the demodulation device, to quantize each value of said quantized demodulated signal inversely using a de-quantization table, providing a de-quantized demodulated signal, to decode said de-quantized demodulated signal, and to calculate a channel decoding error rate of the decoded de-quantized demodulated signal,
- a matching device as described above comprised in the demodulation device or in the channel decoding device.

The invention also relates to a computer program comprising instructions for implementing the matching method cited above according to any one of the particular embodiments described previously, when said program is executed by a processor. This method can be implemented in various ways, notably in wired form or in software form.

This program can use any programming language, and can be in the form of source code, object code, or intermediate code between source code and object code, such as in a partially compiled form, or in any other desirable form.

The invention also relates to a computer-readable storage medium or data medium comprising instructions of a computer program as mentioned above. The recording medium mentioned above can be any entity or device able to store the program. For example, the medium can comprise a storage means, such as a ROM, for example a CD-ROM or a microelectronic circuit ROM, or a magnetic recording means, for example a hard drive. On the other hand, the recording medium can correspond to a transmissible medium such as an electrical or optical signal, that can be carried via an electrical or optical cable, by radio or by other means. The program according to the invention can be downloaded in particular on an Internet-type network.

Alternatively, the recording medium can correspond to an integrated circuit in which the program is embedded, the circuit being matched to execute or to be used in the execution of the method in question.

LIST OF FIGURES

Figure 2B:
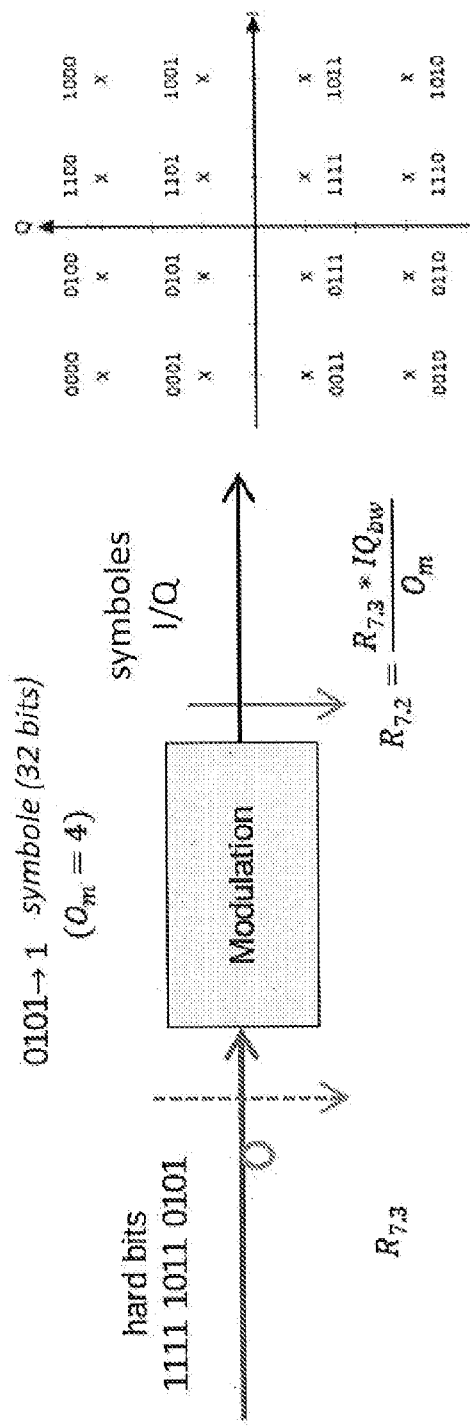
Figure 2B:
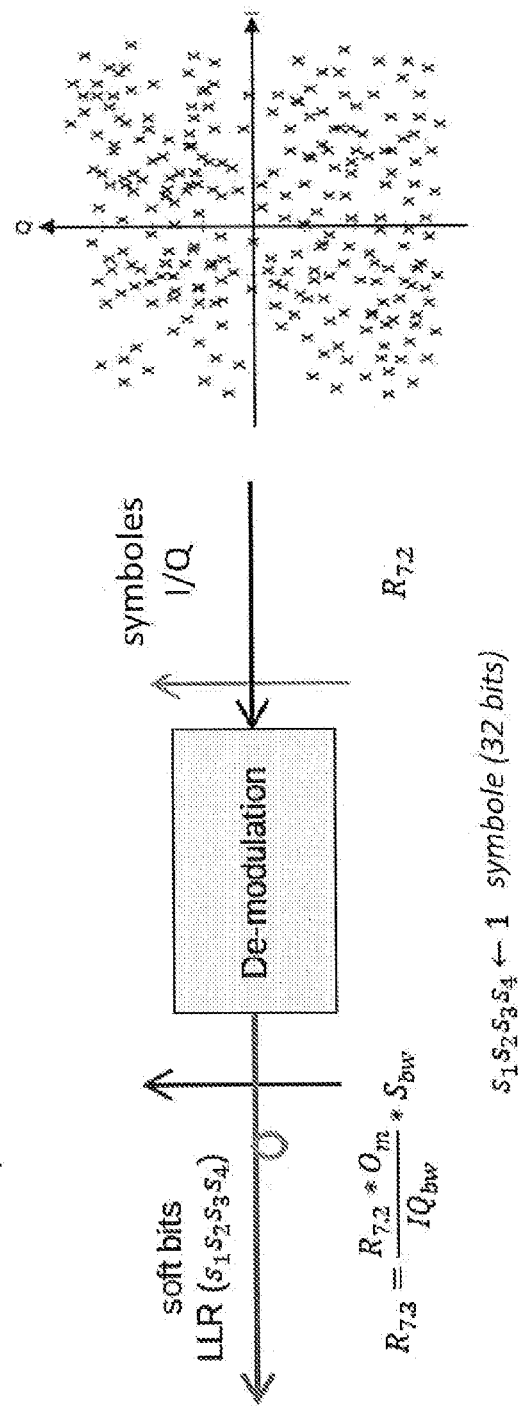
Figure 4:
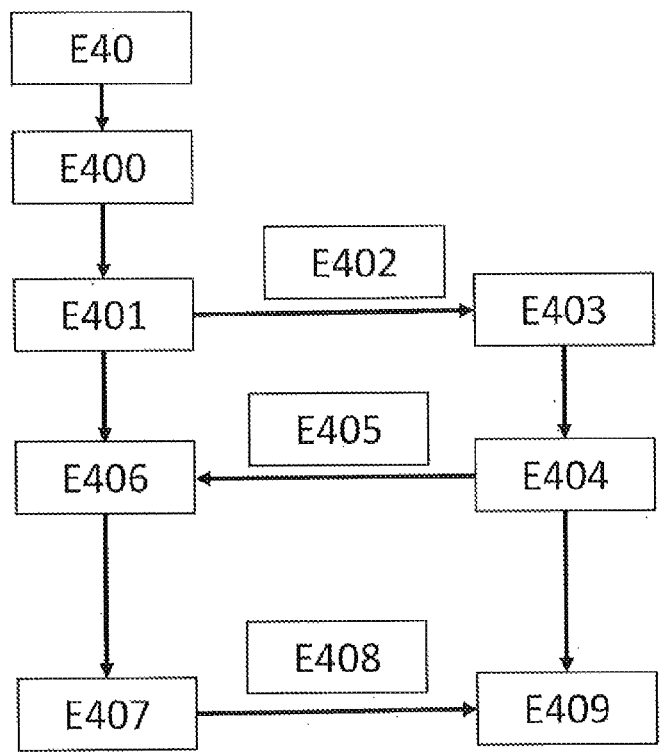
Figure 5:
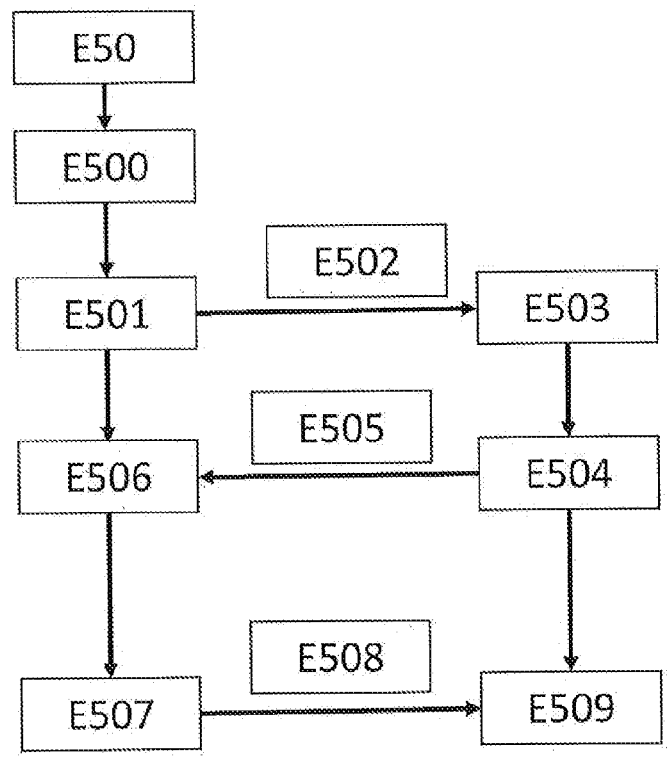
Figure 6:
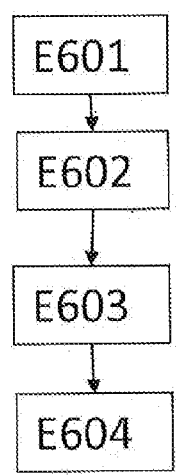
Figure 7:
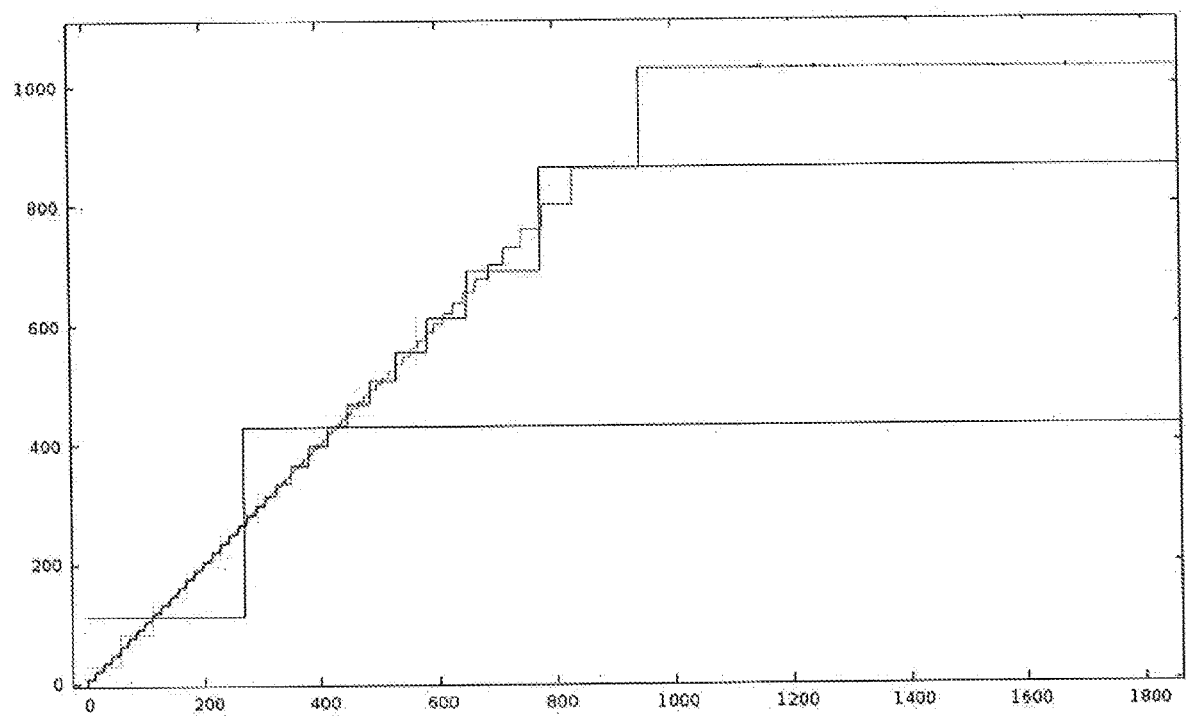
Figure 8:
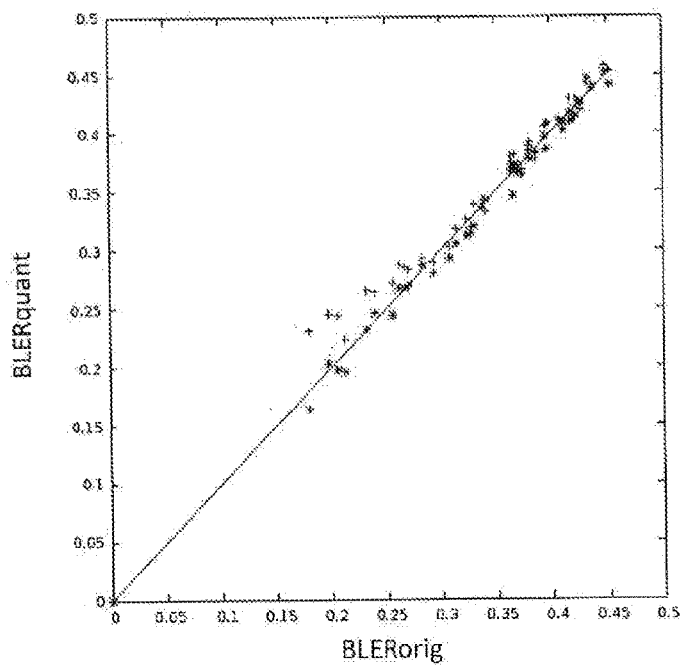

Other characteristics and advantages of the invention will emerge more clearly upon reading the following description of a particular embodiment, provided as a simple illustrative non-restrictive example, and the annexed drawings, wherein:

FIG. 1 diagrammatically illustrates different options for splitting the RAN functions, FIG. 2A diagrammatically illustrates the transmission and reception of data according to the splitting of the RAN functions according to option 7.3, FIG. 2B diagrammatically compares the splitting of RAN functions according to Option 7.2 and Option 7.3, FIG. 3 diagrammatically illustrates an FPGA component for encoding/decoding and a computing platform CALC performing the other RAN functions, FIG. 4 diagrammatically illustrates steps of the method for matching a quantization table of a demodulated radio signal according to a particular embodiment of the invention, FIG. 5 diagrammatically illustrates steps of the method for matching a quantization table of a demodulated radio signal according to another particular embodiment of the invention, FIG. 6 diagrammatically illustrates steps to determine the quantization table according to a particular embodiment of the invention, FIG. 7 illustrates examples of quantization grains, FIG. 8 illustrates a comparison of the BLER before and after quantization of the LLRs.

Figure 12:
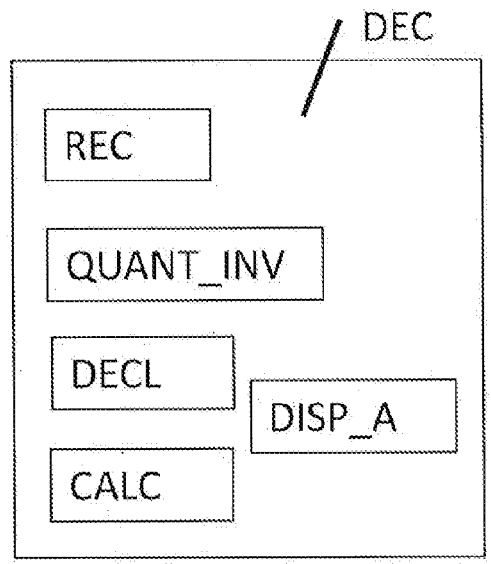
Figure 13:
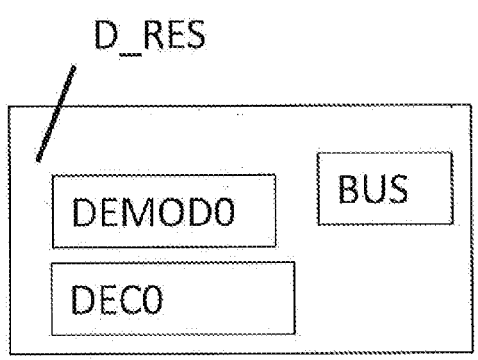

FIG. 9 diagrammatically illustrates steps to determine the quantization table used in the matching method according to another particular embodiment of the invention, FIG. 10 diagrammatically illustrates a matching device according to a particular embodiment of the invention, FIG. 11 diagrammatically illustrates a demodulation device according to a particular embodiment of the invention, FIG. 12 diagrammatically illustrates a channel decoding device according to a particular embodiment of the invention, FIG. 13 diagrammatically illustrates a mobile network device according to a particular embodiment of the invention.

DESCRIPTION OF AN EMBODIMENT OF THE INVENTION

The disaggregation of the RAN has raised questions since its introduction about the dimensioning of the network connecting the high and low functions of the RAN, also called the fronthaul. The first splitting of these functions introduced in the context of the RAN, namely option 8, produced gigantic rates, in the order of 10 Gbit/s per radio cell, given that an antenna is typically equipped with 3 cells covering an angle of 120°.

Subsequently, other splits were introduced, notably the option 2 that can manage the handover of a mobile terminal from one cell to another in a centralised manner and thus dispense with the X2 interface between antennas. However, this split cannot centralise the radio bandwidth allocation and coding to exploit radio resources better.

This is why the 7.x family of options was introduced. Option 7.2 is notably considered by the O-RAN standards alliance. However, as shown in FIG. 2B, option 7.2 consists in transporting I/Q symbols between the high and low functions of the RAN, which can still result in very high throughputs on the fronthaul network.

To address this problem, option 7.3 was proposed in V. Quintuna et al. "Cloud-RAN functional split for an efficient fronthaul network", paper presented at the conference, IWCMC 2020. Option 7.3, also illustrated in FIG. 2B, transfers hard bits in the downlink direction and soft bits (LLR) in the uplink direction. Option 7.3 is also illustrated in FIG. 2A already discussed. A comparison of rates between options 7.2 and 7.3 is provided in tables 2, 3 and 4 below.

TABLE 2

Rates in Gbit/s of the options (splits) 7.2 and 7.3
(MIMO 8, I/Qs with 16 bits, softbits with 5 bits)

|  | Modulation | Option 7.2 | Option 7.3 |
|---|---|---|---|
| Downlink | 256 QAM | 22.2 | 4.1 |
| Uplink | 64 QAM | 21.6 | 20.25 |

Table 2: Rates in Gbit/s of the options (splits) 7.2 and 7.3 (MIMO 8, I/Qs with 16 bits, softbits with 5 bits)

TABLE 3

Rate comparison of options (splits) 7.2 and 7.3
(downlink direction)

| Modulation | 7.2/7.3 |
|---|---|
| QPSK (2) | 16 |
| 16 QAM (4) | 8 |
| 64 QAM (6) | 5.3 |
| 256 QAM (8) | 4 |

Table 3: Rate comparison of options (splits) 7.2 and 7.3 (downlink direction)

TABLE 4

Rate comparison of options (splits) 7.2 and 7.3 (uplink direction).

| Modulation | 7.2/7.3 (8-bit coding) | 7.2/7.3 (4-bit coding) |
|---|---|---|
| QPSK (2) | 2 | 4 |
| 16 QAM (4) | 1 | 2 |
| 64 QAM (6) | 0.7 | 1.3 |
| 256 QAM (8) | 0.5 | 1 |

Table 4: Rate comparison of options (splits) 7.2 and 7.3 (uplink direction).

It is clear that even with option 7.3, the rates in the upload direction can be very high.

The invention proposes to reduce these rates by providing variable coding of LLRs using a quantization of this signal prior to transmission to the channel decoding module.

The quantization is carried out with the help of a quantization table, which can be determined in advance, for example, during an offline learning phase, according to different embodiment variants which will be described later. However, such methods are static in the sense that the quantization table is determined from a learning set in a given environment, in order to best calibrate the quantization intervals, i.e. the size of the bins.

According to the quantization method described in FIG. 4, the LLR signal quantization is enriched by taking into account network environment variables during static learning. Such environment variables are for example an interference level, radio conditions, etc.

The learning space used in static learning then becomes larger and the choice of a quantization table during the effective quantization of the LLR signal is then indexed by these environment variables. Such environment variables are not known during the operational phase.

During this operational phase, the LLR signal received is then quantized using an algorithm (e.g. hysteresis according to the improvement of the BLER observed over the set of possible choices) that modifies the quantization according to these unknown environment variables. A feedback loop is thus implemented on the selection of the quantization in the RU according to the evolution of the BLER observed in the DU.

FIG. 4 diagrammatically illustrates steps of the quantization method and of the inverse quantization method according to this particular embodiment of the invention.

In a step E40, a set of quantization tables is determined from a set of learning radio signals. These quantization tables are determined so as to take into account different environment variables. These environment variables are representative of a quality level of the radio signal transmission and are for example representative of an interference level, radio conditions, etc. Depending on these environment variables, the radio signal received by the antenna is more or less noisy and therefore the channel decoding error rate varies as a consequence.

They are indexed by at least one decoding error rate threshold level (BLER). According to the variant described here, a minimum threshold $S_i^{min}$ and a maximum threshold $S_i^{max}$ for the channel decoding error rate are associated with each quantization table $T_i$. These BLER thresholds are used to determine whether the corresponding quantization table used when quantizing the LLR signal is optimal.

The learning stage can be carried out in an offline learning phase according to different variants, which will be described later.

At the end of step E40, the determined quantization tables and the corresponding thresholds are stored in a memory of the demodulation module.

In step E400, the radio signal received by the base station or terminal antenna is demodulated. The received radio frequency signal, typically comprising I/Q symbols, is demodulated to provide a demodulated signal in the form of soft bits or LLRs. Each value of this demodulated signal corresponds to a log-likelihood ratio of one symbol of the radio signal received by the antenna.

In a step E401, each value of the demodulated signal is quantized using a quantization table $T_i$ stored in the memory of the demodulation module. At initialization, the quantization table $T_i$ used can be chosen as the one determined for environment variables providing a very low noise radio signal, or on the contrary the one determined for environment variables providing a very noisy radio signal, or the quantization table determined for environment variables providing an average decoded radio signal quality.

In step E402, the quantized demodulated signal is transmitted to the channel decoding module to reconstruct the initially transmitted radio signal.

Following reception of the quantized demodulated signal from the demodulation module, in a step E403, each value of the quantized demodulated signal is de-quantized using the de-quantization table $T_i'$, providing a de-quantized demodulated signal. This de-quantized demodulated signal is then decoded according to the channel decoding scheme specified in the Modulation and Coding Scheme (MCS).

In a step E404, a channel decoding error rate $t_{BLER}$ of the decoded de-quantized demodulated signal is calculated.

In a step E405, information representative of this calculated channel decoding error rate $t_{BLER}$ is transmitted to the demodulation module by the channel decoding module.

Following the reception of the information representative of the channel decoding error rate $t_{BLER}$ of the decoded quantized demodulated signal, in a step E406, it is verified whether the channel decoding error rate $t_{BLER}$ is between the thresholds $S_i^{min}$ and $S_i^{max}$. If this is the case, then it is considered that the quantization table $T_i$ used to quantize the LLR signal is optimal. If this is not the case, in a step E407, a new quantization table is selected to replace the quantization table $T_i$, as follows:

if the observed BLER $t_{BLER}$ is strictly greater than $S_i^{max}$, the new quantization table selected is the quantization table $T_j$ with threshold $S_j^{min}=S_i^{max}$.

if the observed BLER $t_{BLER}$ is strictly less than $S_i^{min}$, the new quantization table selected is the quantization table $T_k$ with threshold $S_k^{max}=S_i^{min}$.

In step E408, item of information indicating the use of the newly selected table is transmitted to the channel decoding module. In a step E409, the channel decoding module can thus update the inverse quantization table that it uses.

When processing the next LLR signals, these will be quantized using the newly selected quantization table.

The comparison of the observed BLER with the $S_i^{min}$ and $S_i^{max}$ thresholds is performed here by the demodulation module, as well as the selection of a new quantization table. However, these steps can be done by the channel decoding module, which then informs in this case the demodulation module of the new selected quantization table.

The invention thus allows the quantization table used to compress the LLR signal to be dynamically matched in consideration of the channel decoding performance. According to this variant, the quantization table used oscillates between several quantization tables until the best quantization table is selected.

According to the variant described above, the quantization tables are determined in a static manner and matched by selection in the operational phase.

A further variant is described below in which the initial quantization table is dynamically matched by recalculating the table from the received LLR signal. An online learning of the optimal quantization table is therefore performed. This variant is described in relation to FIG. 5.

In a step E50, an initial quantization table $T_0$ is determined from a set of learning radio signals. For example, this quantization table is determined for environment variables defining an average channel decoding error rate. This table $T_0$ is associated with a channel decoding error rate maximum threshold $S_0^{max}$. This BLER threshold can determine whether the quantization table $T_0$ used when quantizing the LLR signal does not degrade the channel decoding performance too much.

The learning stage can be carried out in an offline learning phase according to different variants, which will be described later.

At the end of step E50, the determined quantization table and the corresponding threshold are stored in a memory of the demodulation module.

In step E500, the radio signal received by the base station or terminal antenna is demodulated. The received radio frequency signal, typically comprising I/Q symbols, is demodulated to provide a demodulated signal in the form of soft bits or LLRs. Each value of this demodulated signal corresponds to a log-likelihood ratio of one symbol of the radio signal received by the antenna.

In a step E501, each value of the demodulated signal is quantized using the quantization table $T_0$ stored in the memory of the demodulation module.

In step E502, the quantized demodulated signal is transmitted to the channel decoding module to reconstruct the initially transmitted radio signal.

Following reception of the quantized demodulated signal from the demodulation module, in a step E503, each value of the quantized demodulated signal is de-quantized using the de-quantization table $T_0'$ corresponding to the quantization table $T_0$, providing a de-quantized demodulated signal. This de-quantized demodulated signal is then decoded according to the channel decoding scheme specified in the Modulation and Coding Scheme (MCS).

In a step E504, a channel decoding error rate $t_{BLER}$ of the decoded de-quantized demodulated signal is calculated.

In a step E505, an item of information representative of this calculated channel decoding error rate $t_{BLER}$ is transmitted to the demodulation module.

Following the reception of the information representative of the channel decoding error rate $t_{BLER}$ of the decoded quantized demodulated signal, in a step E506, it is checked whether the channel decoding error rate $t_{BLER}$ is lower than the threshold $S_0^{max}$. If this is the case, then it is considered that the quantization table $T_0$ used to quantize the LLR signal is optimal. If this is not the case, in a step E507, a new quantization table is calculated to replace the quantization table $T_0$.

This new quantization table can be calculated by any suitable methods, for example those presented below, using the LLR signal values obtained in step E500.

The threshold $S_0^{max}$ can also be updated, for example by decreasing it by a determined value.

In step E508, an item of information indicating the use of the new recalculated table is then transmitted to the channel decoding module, together with the corresponding de-quantization table. In a step E509, the channel decoding module can thus update the inverse quantization table that it uses.

When processing the next LLR signals, these will be quantized using the newly recalculated quantization table.

According to another particular embodiment of the invention, the two variants described above in relation to FIGS. 4 and 5 can be combined. Thus, the quantization table can be matched according to the BLER observed over short integration periods, according to the variant in which the new quantization table is selected from pre-calculated tables. Over a longer integration period, the pre-calculated tables are dynamically re-calculated according to the long-term variations of the system, by learning from the radio signals received during the operational phase.

The following describes methods for determining the quantization tables according to different variants that can be used for the static learning of the quantization tables in step E40 described above with FIG. 4 or in step E50 described above with FIG. 5, or in the dynamic learning in step E507 described with FIG. 5.

FIG. 6 shows steps for determining a quantization table used in the matching method described above.

According to the particular embodiment described here, the quantization table is determined by a companding method.

A set of demodulated learning radio frequency signals received by an antenna is considered, providing a set of demodulated radio signals. This set of learning radio frequency signals is used to estimate the distribution of the absolute value of LLRs.

In a step E601, the distribution of the absolute value of the demodulated radio signal values is estimated. In a step E602, for at least one quantization level corresponding to a representation of the quantized values of the demodulated signal quantized over a determined number of bits, quantization intervals are calculated from the estimated distribution.

In step E602, an optimal scalar quantization is determined. This optimal quantization is achieved by the companding method, which consists in producing equiprobable buckets or bins from the non-uniform distribution estimated in step E601. In other words, the companding method determines quantization intervals that comprise substantially the same number of values of the demodulated radio signal.

To obtain these quantization intervals, the non-linear transformation required is the inversion of the cumulative probability distribution. In practice, it is achieved by sorting followed by regularly grouping into bins. The result is a quantization reference system or bucket list.

An example of a list of buckets or quantization intervals is shown in FIG. 7 for different quantization levels corresponding to 2, 8, 32, and 128 respectively. It can be seen that the level of quantization corresponds to the number of buckets obtained. For example, a quantization with 2 levels of quantization uses two quantization intervals.

Step E602 is implemented for different quantization levels, for example levels 2, 8, 32 and 128.

One quantization table per quantization level is thus obtained. Each quantization table comprises the quantization intervals of the input signal values and associates with each quantization interval the index associated with the quantized value representing the values of this quantization interval.

In a step E603, a quantization table is selected from the quantization tables obtained. The quantization table is selected so that it minimizes a rate-distortion cost, where the rate corresponds to the rate used to represent the quantized values and the distortion is calculated between the values of the demodulated radio signal and the quantized values. According to another embodiment, the table can be selected by considering the channel decoding error introduced by the quantization. The decoding error can indeed be measured to verify that the quantization of the LLR signal does not degrade the overall performance of the channel coding. The channel decoding error is measured, for example, by the Block Error Rate (BLER) from the signal decoded by the channel decoding module FIG. 8 shows a comparison of the BLER before (BLERorig) and after LLR quantization (BLERquant) for different quantization levels (2, 4 and 8). In FIG. 8, it can be seen that a quantization based on 8 bins offers a good compromise, inducing a minimal additional error while allowing a 4-bit encoding of the LLRs (1 sign bit+3 absolute value bits). This reduces the bandwidth for transporting LLRs by a factor of 4 compared to the initial 16-bit coding.

In step E604, the selected quantization table is stored in a memory of the demodulation module.

According to the particular embodiment described here, the determination of the quantization table was carried out by a "companding" method. Other variants of the invention are possible for obtaining the quantization table. Notably, a Lloyd-Max type method can be used to define the quantization intervals.

The Lloyd-Max method determines an optimal scalar quantizer by minimising a distortion. Such a distortion is calculated between the input signal, i.e. the absolute values of the demodulated radio signal values, and the reconstructed signal, i.e. the absolute values of the demodulated radio signal values quantized and de-quantized.

FIG. 9 diagrammatically illustrates steps to determine the quantization table used in the matching method according to another particular embodiment of the invention. According to this particular embodiment of the invention, the quantization table(s) are determined so as not to degrade the overall performance of the channel coding, as measured by the BLER (Block Error Rate). Notably, according to this particular embodiment, the quantization table is determined during the learning phase according to an end-to-end optimisation taking into account the global performance of the channel coding. According to this particular embodiment of the invention, the complete decoding chain is integrated in the optimisation loop, in order to find the optimal parameters for the quality criterion of the LLR decoding.

Due to its structure (Turbo-Decoder, LDPC, Polar Codes), the decoding quality is a non-differentiable function of the input parameters which are the quantization steps of the LLRs. Thus, any classical gradient descent based optimisation method is excluded.

"Gradient-free" methods are used, such as genetic algorithms, but other optimisation methods are also possible (e.g. simulated annealing). In these methods, one considers a set of vectors in the parameter space that are "candidates", and a "matching function" defined on this space, that is sought to be maximised.

A vector in the parameter space corresponds to a quantization table defining the quantization intervals or quantization steps for quantizing the LLR signal values.

According to this particular embodiment, the quantization table is determined from a set of learning LLR signals.

The set of learning LLR signals used in the optimisation process described below corresponds to radio signals, typically I/Q symbols, transmitted according to a channel coding level and demodulated to provide a demodulated signal in the form of soft bits or LLR. Each value of this demodulated signal corresponds to a log-likelihood ratio of one symbol of the radio signal received by the antenna.

In a step E90, a set of candidate quantization vectors is determined.

At initialisation, a set of candidate quantization tables is therefore determined, for example by a "companding" method.

Then, for each candidate quantization vector, in a step E91, the learning LLR signals are quantized using the candidate quantization vector, providing quantized learning LLR signals. In a step E92, the quantized learning LLR signals are decoded according to the channel coding level. Prior to channel decoding, these quantized LLR signals are de-quantized.

In a step E93, an error is calculated between the decoded quantized learning LLR signals and the decoded non-quantized learning LLR signals, according to the chosen matching function.

In a step E95, the quantization vector is selected from the set of candidate quantization vectors that minimizes the error between the decoded quantized learning LLR signals and the decoded non-quantized learning LLR signals.

According to a variant of this particular embodiment of the invention, the optimisation phase is based on a genetic algorithm. According to this particular embodiment of the invention, the quantization vector is selected in step E95, if a stop criterion of the algorithm is met. Such a stop criterion may comprise a maximum number of iterations of the algorithm reached, a convergence criterion of the algorithm reached.

If the stop criterion is not met, in a step E94, an optimisation of the candidate quantization vectors is performed, and the method iterates steps E91-E93 for the new set of candidate quantization vectors.

In the case of genetic algorithms as used in the invention, the set of candidate quantization vectors is "evolved" as a "population of individuals" by applying principles from evolutionary theory: probability of reproduction proportional to the matching function, random mutations, random hybridizations. Such a method produces an incremental improvement in the suitability of the best candidate quantization vector. At convergence, there is a local optimum.

The implementation of this variant consists in using a "gradient-free" method e.g., the genetic algorithm on a representative dataset, here the LLRs learning signals. The matching function is an evaluation of the performance of a decoder of the type considered (Turbo/LDPC/Polar), and determined by the level of MCS channel coding considered. The large number of evaluations required (many individuals and generations) may necessitate the use of accelerated hardware for decoding during this optimisation phase.

But once convergence is achieved or the stop criterion is met, the optimal candidate quantization vector is extracted (E95), and in a step E96, stored by the demodulation module.

This optimal quantization vector is then used in a real-time system: it is a quantization table.

The variant described in relation to FIG. 9 is described in the case of the minimisation of the BLER. According to one embodiment, the optimisation method described in FIG. 9 can be implemented by minimising the error between the learning LLR signals at the input and the quantised and de-quantised learning LLR signals. According to this variant, it is unnecessary to decode the channel of the quantized learning LLR signals. This variant is simpler in terms of computational cost, but the selected quantization vector does not take into account the performances of the channel decoding.

The methods for determining a quantization table described above are implemented for known environment variables (interference level, radio conditions). The chosen determination method is applied for different sets of environment variables, respectively providing different qualities of decoded radio signal. A quantization table is determined for each set of environment variables. BLER thresholds corresponding to each set of environment variables are associated with each quantization table. For example, a minimum and a maximum threshold are defined defining a BLER interval in which the observed BLER of the radio signal must lie during the operational phase when the demodulated signal of this radio signal is quantized with the quantization table corresponding to the thresholds. In other examples, only one threshold per quantization table may be used, which defines the maximum limit of the BLER observed. If the BLER observed is above this threshold, the quantization table must be matched.

FIG. 10 diagrammatically illustrates a matching device DISP_A according to a particular embodiment of the invention. Such an invention is notably configured to implement the coding method according to any one of the particular embodiments of the invention defined above.

The matching device DISP_A notably comprises a processor PROC and a memory MEM configured to obtain an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding, and match the quantization table when the channel decoding error rate is greater than a determined threshold.

These functions can be set by means of instructions from a computer program PG stored in memory MEM and executed by the processor PROC.

The matching device DISP_A also comprises a transmission module TRANS for transmitting an item of information representative of the matching of the quantization table to a channel decoding device or to a demodulation device.

According to a particular embodiment of the invention, this matching device is comprised in a demodulation device. This demodulation device corresponds, for example, to the demodulation module of the unit RU in FIG. 2A.

According to another particular embodiment of the invention, this matching device is comprised in a channel decoding device. This channel decoding device corresponds, for example, to the channel decoding module of the unit DU in FIG. 2A.

FIG. 11 diagrammatically illustrates a demodulating device DISP_D according to a particular embodiment of the invention. Such an invention is notably configured to implement the coding method according to any one of the particular embodiments of the invention defined above.

The demodulation device DISP_D notably comprises:
- a demodulation module DEMOD configured to demodulate a radio signal received by an antenna, providing a demodulated signal,
- a quantization module QUANT configured to quantize each value of said demodulated signal using a quantization table stored in memory MEMO, providing a quantized demodulated signal,
- a transmission module COM configured to transmit said quantized demodulated signal to a channel decoding device, and
- a matching device DISP_A described in relation to FIG. 10.

According to a particular embodiment of the invention, this demodulation device corresponds, for example, to the demodulation module of the unit RU in FIG. 2A.

According to a particular embodiment of the invention, the channel decoding device of the unit DU of FIG. 2A is configured to update the de-quantization table used to de-quantize the quantized demodulated signal prior to the channel decoding of that signal in accordance with information transmitted by the demodulating device. The invention also relates to such a matched channel decoding device.

FIG. 12 diagrammatically illustrates a channel decoding device DEC according to a particular embodiment of the invention. Such an invention is notably configured to implement the coding method according to any one of the particular embodiments of the invention defined above.

The channel decoding device DEC notably comprises:
- a reception module REC configured to receive said quantized demodulated signal from a demodulation device configured to demodulate a radio signal received by a radio antenna of a mobile network,
- an inverse quantization module QUANT_INV configured to quantize each value of said quantized demodulated signal inversely using a de-quantization table, providing a de-quantized demodulated signal,
- a channel decoding module DECL configured to decode said de-quantized demodulated signal,
- a calculation module CALC configured to calculate a channel decoding error rate of the decoded de-quantized demodulated signal, and
- a matching device DISP_A described in relation to FIG. 10.

According to a particular embodiment of the invention, this channel decoding device corresponds, for example, to the channel decoding device of the unit DU in FIG. 2A. According to a particular embodiment of the invention, the demodulation device of the unit RU of FIG. 2A is configured to update the quantization table used to quantize the demodulated signal prior to transmission to the channel decoding device, according to an item of information transmitted by the channel decoding device. The invention also relates to such a matched demodulating device.

FIG. 13 diagrammatically illustrates a mobile network device D_RES according to a particular embodiment of the invention. Such an invention is notably configured to implement the coding method according to any one of the particular embodiments of the invention defined above.

The mobile network device D_RES notably comprises:
- a demodulation device DEMOD0 configured to demodulate said radio signal received by said antenna, providing a demodulated signal, and to quantize each value of said demodulated signal using a quantization table, providing a quantized demodulated signal,
- a channel decoding device DEC0 in the form of a programmable circuit configured to implement a channel decoding scheme of the de-quantized demodulated signal,
- at least one communication bus BUS able to transmit the quantized demodulated signal from the demodulation device to the channel decoding device.

According to this particular embodiment of the invention, a matching device DISP_A described in relation to FIG. 10 is comprised in the demodulation device or in the channel decoding device.

The invention claimed is:

1. A method implemented by a device for matching a quantizing table of data representative of a radio signal received by a radio antenna of a mobile network, comprising:
   obtaining an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding,
   matching the quantization table in response to the channel decoding error rate being greater than a determined threshold, wherein the matching of the quantization table comprises calculating a new quantization table from the demodulated received radio signal, and
   transmitting an item of information representative of the matching of the quantization table to a channel decoding device or to a demodulation device.

2. The method according to claim 1, further comprising matching the quantization table in response to the channel decoding error rate being less than another determined threshold.

3. The method according to claim 1, wherein each value of the demodulated signal is representative of a log-likelihood ratio of a symbol of said radio signal received by said antenna.

4. A device comprising:
   at least one processor and at least one memory containing instructions which when executed by the at least one processor configure the device to match a quantization table of data representative of a radio signal received by a radio antenna of a mobile network, by:
   obtaining an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding, and
   matching the quantization table in response to the channel decoding error rate being greater than a determined threshold, wherein the matching of the quantization table comprises calculating a new quantization table from the demodulated received radio signal, and transmitting an item of information representative of the matching of the quantization table to a channel decoding device or to a demodulation device.

5. The device according to claim 4, wherein the instructions further configure the device to:

demodulate said radio signal received by said antenna, providing a demodulated signal, quantize each value of said demodulated signal using the quantization table, providing the quantized demodulated radio signal, transmit said quantized demodulated radio signal to a channel decoding module.

6. The device according to claim 4, wherein the instructions further configure the device to:

receive said quantized demodulated radio signal from a demodulation device configured to demodulate the radio signal received by the radio antenna of the mobile network, de-quantize each value of said quantized demodulated signal inversely using a de-quantization table, providing a de-quantized demodulated signal, decode said de-quantized demodulated signal, and calculate the channel decoding error rate of the decoded de-quantized demodulated signal.

7. The device according to claim 4 wherein the device is implemented in a server.

8. A mobile network device comprising:

a demodulation device configured to demodulate a radio signal received by a radio antenna of a mobile network, providing a demodulated signal, and to quantize each value of said demodulated signal using a quantization table, providing a quantized demodulated signal, a channel decoding device in the form of a programmable circuit configured to a de-quantize the quantized demodulated signal to produce a de-quantized demodulated signal and implement a channel decoding scheme to decode the de-quantized demodulated signal to produce a decoded de-quantized demodulated signal, at least one communication bus able to transmit the quantized demodulated signal from the demodulation device to the channel decoding device, and a matching device comprised in the demodulation device or in the channel decoding device, the matching device comprising a processor and a memory configured to:

obtain an item of information representative of a channel decoding error rate of the decoded de-quantized demodulated signal, match the quantization table in response to the channel decoding error rate being greater than a determined threshold, and transmit an item of information representative of the matching of the quantization table to the channel decoding device or to the demodulation device.

9. A mobile network system comprising:

at least one radio antenna, configured to receive a radio signal, at least one unit implementing low functions of the mobile network, comprising at least one demodulation device, which is configured to demodulate said radio signal received by said antenna, providing a demodulated signal, to quantize each value of said demodulated signal using a quantization table, providing a quantized demodulated signal, and to transmit said quantized demodulated signal to at least one channel decoding device, at least one unit for implementing high functions of the mobile network, comprising at the least one channel decoding device, which is configured to receive said quantized demodulated signal from the demodulation device, to de-quantize each value of said quantized demodulated signal inversely using a de-quantization table, providing a de-quantized demodulated signal, to decode said de-quantized demodulated signal, and to calculate a channel decoding error rate of the decoded de-quantized demodulated signal, and a matching device comprised in the demodulation device or in the channel decoding device, the matching device comprising a processor and a memory configured to:

obtain an item of information representative of the channel decoding error rate of the decoded de-quantized demodulated signal, match the quantization table in response to the channel decoding error rate being greater than a determined threshold, and transmit an item of information representative of the matching of the quantization table to the channel decoding device or to the demodulation device.

10. A method implemented by a device for matching a quantizing table of data representative of a radio signal received by a radio antenna of a mobile network, comprising:

obtaining an item of information representative of a channel decoding error rate of a decoded quantized demodulated signal from a demodulation of the radio signal received by said antenna, said demodulated radio signal having been quantized by said quantization table, and said quantized demodulated radio signal having undergone a channel decoding, matching the quantization table in response to the channel decoding error rate being greater than a determined threshold, wherein the matching of the quantization table comprises selecting a new pre-calculated quantization table, the new pre-calculated quantization table belonging to a group of pre-calculated quantization tables in which each quantization table is associated with a maximum channel decoding error rate threshold and a minimum channel decoding error rate threshold, the new quantization table being selected according to a value of the channel decoding error rate of the received radio signal in relation to minimum and maximum channel decoding error rate thresholds associated with the quantization tables of the group, and transmitting an item of information representative of the matching of the quantization table to a channel decoding device or to a demodulation device.

* * * * *